(12) United States Patent
Kitamura et al.

(10) Patent No.: US 10,454,385 B2
(45) Date of Patent: Oct. 22, 2019

(54) POWER CONVERSION DEVICE

(71) Applicant: Mitsubishi Electric Corporation, Tokyo (JP)

(72) Inventors: Tatsuya Kitamura, Tokyo (JP); Kohei Onda, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 16/083,563

(22) PCT Filed: Feb. 17, 2017

(86) PCT No.: PCT/JP2017/005815
§ 371 (c)(1),
(2) Date: Sep. 10, 2018

(87) PCT Pub. No.: WO2017/221456
PCT Pub. Date: Dec. 28, 2017

(65) Prior Publication Data
US 2019/0131883 A1 May 2, 2019

(30) Foreign Application Priority Data
Jun. 21, 2016 (JP) .................................. 2016-122419

(51) Int. Cl.
*H02M 7/00* (2006.01)
*H01L 25/07* (2006.01)
(Continued)

(52) U.S. Cl.
CPC ............ *H02M 7/003* (2013.01); *H01L 25/07* (2013.01); *H01L 25/18* (2013.01); *H02M 7/44* (2013.01);
(Continued)

(58) Field of Classification Search
CPC .......... H02M 7/003; H02M 7/44; H02M 7/48; H05K 7/209; H05K 7/2089; H05K 5/064; H05K 7/06; H01L 25/07; H01L 25/18
(Continued)

(56) References Cited

U.S. PATENT DOCUMENTS 5,610,799 A * 3/1997 Kato ....................... H01L 23/24
174/252
2010/0157640 A1* 6/2010 Azuma ..................... B60L 3/12
363/132
(Continued)

FOREIGN PATENT DOCUMENTS

| JP | 7-297575 A | 11/1995 |
| JP | 2002-325467 A | 11/2002 |
| JP | 2004-39749 A | 2/2004 |
| JP | 2004-221516 A | 8/2004 |

OTHER PUBLICATIONS

International Search Report for PCT/JP2017/005815 dated May 16, 2017 (PCT/ISA/210).

*Primary Examiner* — Anthony M Haughton
*Assistant Examiner* — Yahya Ahmad
(74) *Attorney, Agent, or Firm* — Sughrue Mion, PLLC; Richard C. Turner

(57) ABSTRACT

A power conversion device that supplies power to a load using a module incorporating a semiconductor element is such that a sealing wall that holds a sealing resin is provided on a metal case that cools the module, a feedback current channel, which is one wiring member forming a current channel that passes into and out of the semiconductor element, is the metal case, and another wiring member is disposed in proximity to and parallel with the sealing wall of the metal case.

18 Claims, 6 Drawing Sheets

(51) Int. Cl.
  *H01L 25/18* (2006.01)
  *H02M 7/48* (2007.01)
  *H05K 7/06* (2006.01)
  *H02M 7/44* (2006.01)
  *H05K 5/06* (2006.01)
  *H05K 7/20* (2006.01)

(52) U.S. Cl.
  CPC .............. *H02M 7/48* (2013.01); *H05K 5/064* (2013.01); *H05K 7/06* (2013.01); *H05K 7/209* (2013.01); *H05K 7/2089* (2013.01)

(58) Field of Classification Search
  USPC ................................................ 361/600–678
  See application file for complete search history.

(56) References Cited

U.S. PATENT DOCUMENTS

| | | | | |
|---|---|---|---|---|
| 2012/0300522 | A1* | 11/2012 | Tokuyama | H01L 25/072 363/131 |
| 2013/0176761 | A1* | 7/2013 | Hattori | H02M 7/003 363/131 |
| 2015/0195957 | A1* | 7/2015 | Ohoka | H05K 7/20927 361/702 |
| 2018/0358903 | A1* | 12/2018 | Takahashi | H01L 23/4012 |
| 2019/0088594 | A1* | 3/2019 | Ikeda | H01L 25/07 |
| 2019/0098777 | A1* | 3/2019 | Nakatsu | H05K 5/0026 |
| 2019/0103344 | A1* | 4/2019 | Fukase | H01L 23/49575 |

* cited by examiner

POWER CONVERSION DEVICE

CROSS REFERENCE TO RELATED APPLICATIONS

This application is a National Stage of International Application No. PCT/JP2017/005815 filed Feb. 17, 2017, claiming priority based on Japanese Patent Application No. 2016-122419, filed Jun. 21, 2016.

TECHNICAL FIELD

The present invention relates to a power conversion device, and in particular, relates to a power supply device of a power conversion device.

BACKGROUND ART

As a basic configuration of a power module configuring a power conversion device, a power circuit substrate, and a cooling fin, there is a configuration disclosed in, for example, JP-A-2002-325467 (Patent Document 1). The power conversion device disclosed in Patent Document 1 incorporates an inverter configured of a semiconductor element, and has a power module electrically isolated from the inverter and a cooling fin configured of an electrically conductive material to which the power module is attached, wherein sealing of the module with a non-electrically conductive, thermally conductive fluid resin is realized by a wall enclosing the module being provided on a module attachment face of the cooling fin.

CITATION LIST

Patent Literature

Patent Document 1: JP-A-2002-325467

SUMMARY OF INVENTION

Technical Problem

According to the power conversion device disclosed in Patent Document 1, a structure is such that a wall that encloses and houses a module is provided on a cooling fin, and a tank configured of the cooling fin and the wall is filled with a non-electrically conductive, thermally conductive fluid resin that seals the module, because of which there are advantages in that the cooling fin and the wall can be manufactured by integral molding or the like, assembly man-hours when manufacturing can be reduced, and a cost can be kept low.

However, the existing power conversion device is such that a semiconductor element and a module are electrically isolated, and a current path is routed by wiring on a power circuit substrate via an external electrode terminal. Because of this, particularly when energizing with a large current, there is a problem in that the power circuit substrate increases in size due to a wiring width increasing, a large mounting area is needed, and the power conversion device as a whole increases in size.

Also, due to wiring routing restrictions caused by a disposition of parts on the power circuit substrate, there is a problem in that a loop forming a current path increases in size, parasitic inductance of the wiring increases, and an overvoltage, an overcurrent, or noise caused by a resonance phenomenon increases.

The invention, having been contrived in order to resolve these kinds of problem, has an object of providing a power conversion device such that the power conversion device can be reduced in size, and parasitic inductance of a current loop formed by wiring can be reduced.

Solution to Problem

A power conversion device of the invention is a power conversion device including a module incorporating a semiconductor element, a control substrate on which a circuit that controls so as to drive the semiconductor element is mounted, control wiring that connects the module and the control substrate, a sealing material that seals the module and one portion or a whole of the control substrate, a metal case to which the module is attached, which has a sealing wall standing on a periphery of the module and holds the sealing material, and which is connected to a reference potential, reference potential wiring that connects a reference potential of the module and the metal case, and a bus bar that forms a current path to the module, and is characterized in that the bus bar is disposed in proximity to and parallel with the sealing wall.

Advantageous Effects of Invention

According to the power conversion device of the invention, an area of a wiring member drawn out from a module is reduced, and parasitic inductance can be reduced by a loop formed by a current path being reduced in size. Consequently, a resonance phenomenon in a circuit is restricted, which can contribute to preventing an occurrence of an overvoltage or an overcurrent and an increase in noise.

The foregoing and other objects, features, aspects and advantages of the invention will become more apparent from the following detailed description of the invention when taken in conjunction with the accompanying drawings.

DESCRIPTION OF EMBODIMENTS

Figure 1:
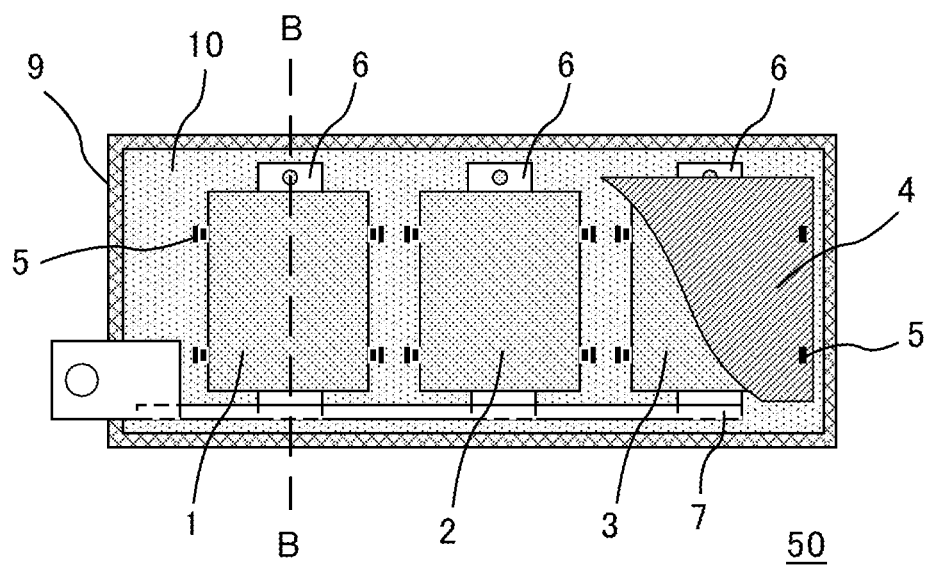
FIG. 1 is a plan view showing a power conversion device according to a first embodiment of the invention.

Hereafter, referring to the drawings, preferred embodiments of a power conversion device according to the invention will be described.

First Embodiment

Figure 2:
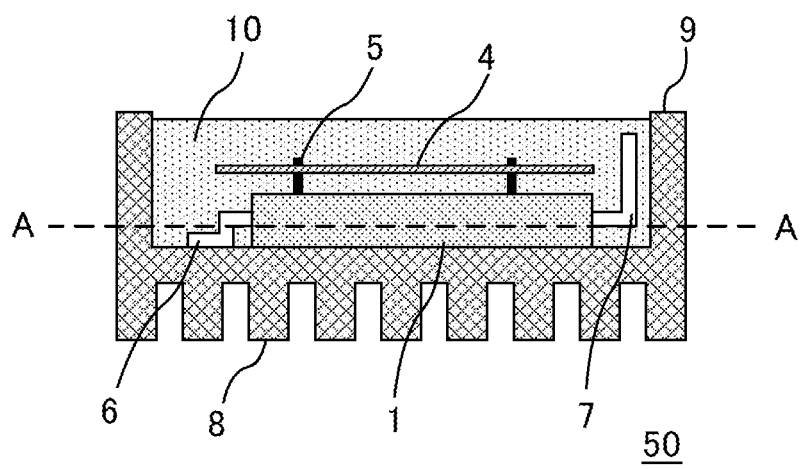
FIG. 2 is a sectional view showing the power conversion device according to the first embodiment of the invention.

FIG. 1 and FIG. 2 are a plan view and a sectional view showing a power conversion device according to a first embodiment of the invention. FIG. 1 shows a sectional view along an A-A line of FIG. 2, and FIG. 2 shows a sectional view along a B-B line of FIG. 1.

A power conversion device 50 according to the first embodiment is configured of modules 1, 2, and 3, a control substrate 4, control wiring 5, reference potential wiring 6, a bus bar 7, an electrically-conductive metal case 8, a sealing wall 9, and a sealing resin 10 of a sealing material held by the sealing wall 9. Further, the modules 1, 2, and 3 are electrically connected via a reference potential of a power supply (not shown) connected to the metal case 8 and the reference potential wiring 6, and the control substrate 4, which controls so as to drive the modules 1, 2, and 3, is electrically connected to the modules 1, 2, and 3 via the control wiring 5. Also, the bus bar 7 is connected between the power supply, and the like, and the multiple of modules 1, 2, and 3.

The metal case 8 has the sealing wall 9, which is of a wall-form structure integrated with the metal case 8, stands on a periphery of the modules 1, 2, and 3, and is filled with the sealing resin 10 so as to cover the modules 1, 2, and 3 and one portion or a whole of the control substrate 4. Also, a heat dissipating projecting portion is formed on a face of the metal case 8 opposite to a face to which the modules 1, 2, and 3 are attached.

The power conversion device having this kind of configuration is such that when semiconductor elements incorporated in the modules 1, 2, and 3 operate, a current as large as several hundred amperes flows, and passes through wiring such as the bus bar 7. The wiring has electrical resistance, and taking heat generation into consideration, there is a limit to a current that can be safely caused to flow. In order to be able to cause a large current to flow, it is necessary to reduce the electrical resistance of the wiring, for which increasing a sectional area of the wiring is effective. When increasing the sectional area of the wiring, disposing a longer side of the cross-section in a horizontal direction with respect to the module attachment face of the metal case 8 necessitates widening the module attachment face of the metal case 8 in order to secure a region for the wiring to pass through, which increases the size of the power conversion device.

Also, as the reference potential of the modules 1, 2, and 3 is electrically connected to the metal case 8 via the reference potential wiring 6, a feedback path of current passing from the power supply, through the bus bar 7, and through the semiconductor elements incorporated in the modules 1, 2, and 3 passes through the metal case 8, forming a current loop. The current loop has parasitic inductance due to the wiring, the parasitic inductance increases further the greater an area of the current loop, and energy is accumulated in accordance with a change in the current. Because of this, a resonance phenomenon is caused to occur in the circuit, causing an overvoltage or an overcurrent to occur, and causing noise to increase.

Because of this, the power conversion device 50 according to the first embodiment is such that the bus bar 7, after being drawn out from the modules 1, 2, and 3, is disposed so that a vertical direction with respect to the module attachment face of the metal case 8 forms the longer side of the cross-section, as shown in FIG. 2. The control substrate 4 is disposed above the modules 1, 2, and 3, connected via the control wiring 5, because of which there is no need to widen the module attachment face of the metal case 8, and a region secured in order to increase the sectional area of the bus bar 7 can be restricted.

Furthermore, the bus bar 7 disposed so that the vertical direction with respect to the module attachment face of the metal case 8 forms the longer side of the cross-section is disposed in proximity to and parallel with the sealing wall 9, which is integrated with the metal case 8. For example, current from the power supply enters the module 1 with the bus bar 7 as an outward path, and as the module 1 is electrically connected to the metal case 8 via the reference potential wiring 6, current to the power supply flows to the reference potential of the power supply with the metal case 8 as a return path. In this case, the outward path current flows along a path in which current loop impedance is smallest, and by the sealing wall 9 disposed in proximity to and parallel with the bus bar 7 forming the return path, the parasitic inductance of the current loop can be restricted.

Figure 3:
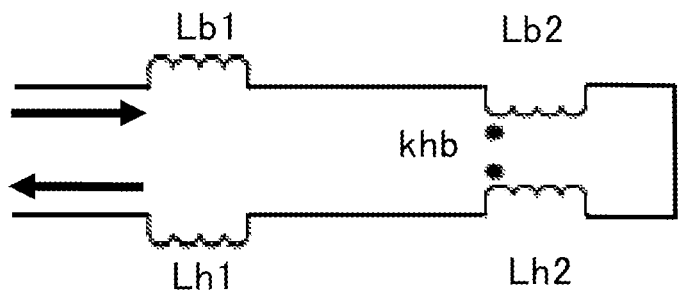
FIG. 3 is a schematic view illustrating an inductance reduction effect according to the first embodiment of the invention.

FIG. 3 is a schematic view illustrating a principle of the embodiment. FIG. 3 shows in simplified form parasitic inductance of a current path returning through the bus bar 7, the module 1, and the metal case 8. Lb1 and Lb2 in the drawing represent, for example, parasitic inductance elements of the bus bar 7, while Lh1 and Lh2 represent parasitic inductance elements of the metal case 8. For the sake of simplification, however, parasitic inductance of the module 1 is omitted. When the embodiment is not applied, the parasitic inductance of the current loop is Lb1+Lh1+Lb2+Lh2. Meanwhile, the embodiment provides the sealing wall 9 disposed in proximity to and parallel with the bus bar 7 in the metal case 8, whereby the parasitic inductance element Lb2 of the bus bar 7 is coupled to the parasitic inductance element Lb2 of the sealing wall 9 of the metal case 8 by a coupling coefficient khb (0<khb<1). As a result of this, the parasitic inductance of the current path loop is Lb1+Lh1+Lb2+Lh2−khb√(Lb2·Lh2), meaning that the current loop inductance can be reduced in comparison with the case in which the embodiment is not applied.

Desirably, an interval between the bus bar 7 and the sealing wall 9 is equal to or greater than a distance such that electrical isolation can be maintained with respect to a difference in potential between the bus bar 7 and the sealing wall 9, and equal to or less than the length of the longer side of the cross-section of the bus bar 7, whereby a region occupied by the bus bar 7 can be minimized, and the inductance of the loop formed by the current path can be minimized.

Hereafter, referring to FIG. 4, a description will be given of how the inductance can be reduced by the interval between the bus bar 7 and the sealing wall 9 being equal to or less than the length of the longer side of the cross-section of the bus bar 7. Firstly, a conductor plate simulating the bus bar 7 and a conductor plate simulating the sealing wall 9 will be considered. The conductor plates are both such that a longer side dimension of a cross-section of the plate is W, a shorter side dimension (thickness) of the cross-section of the plate is infinitesimal, and a length of the plate is L/2. The two plates are electrically connected, a current loop of a length L is formed, and a parasitic inductance thereof is evaluated.

Firstly, a case in which the conductor plate simulating the bus bar 7 and the conductor plate simulating the sealing wall 9 are disposed in the same straight line will be considered as an extreme example to which the embodiment is not applied. It is known that a parasitic inductance Lss of the current loop in this case is provided by the following Expression 1 for an infinitesimal plate of length L and width W.

$$Lss = (\mu_0 \cdot L/2\pi)[\text{Ln}(2L/W) + \tfrac{1}{2} + (W/3L)]$$ (Expression 1)

Herein, μ0 is permeability of a vacuum. Next, a case in which, applying the embodiment, the conductor plate simulating the bus bar 7 and the conductor plate simulating the sealing wall 9 are disposed opposing and in parallel, distanced by a distance D, will be considered. It is known that a parasitic inductance Lsp of the current loop in this case is provided by the following Expression 2.

$$Lsp=\mu 0 \cdot L(D/W) \quad \text{(Expression 2)}$$

Figure 4:
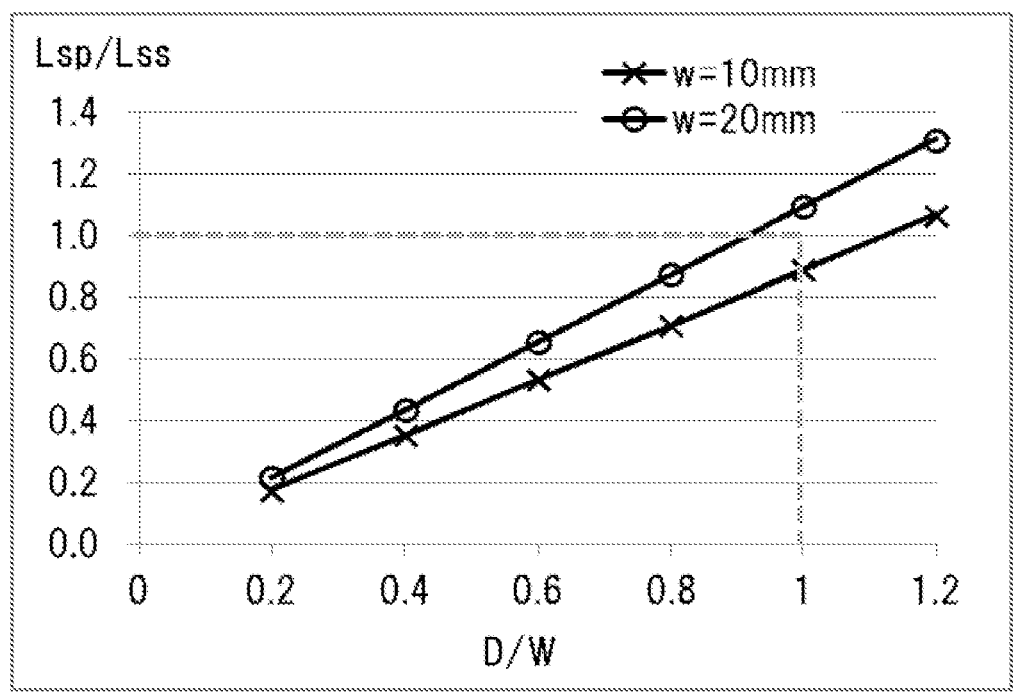
FIG. 4 is a diagram showing results of the inductance reduction effect according to the first embodiment of the invention calculated using a simplified model.

FIG. 4 shows a relationship between a ratio D/W between an inter-plate distance D and the plate width W and a ratio Lsp/Lss in Expression 1 and Expression 2 for two examples, one in which the plate length L is 100 mm and the plate width W is 10 mm, and one in which the plate length L is 100 mm and the plate width W is 20 mm. In order for Lsp/Lss to be 1 or less, it is roughly sufficient that D/W is smaller than 1, as shown by the results in FIG. 4. That is, by the interval between the bus bar 7 and the sealing wall 9 being equal to or less than the length of the longer side of the cross-section of the bus bar 7, an advantage is obtained in that the current loop inductance is reduced. For example, when D/W is in the region of 0.2 owing to the embodiment being applied, the current loop inductance can be reduced by in the region of 80 percent.

By the embodiment being applied, as heretofore described, there are advantages in that size is reduced by the region occupied by the bus bar 7, which is compatible with a large current, being restricted, and an occurrence of overvoltage, overcurrent, and noise is reduced by the parasitic inductance formed by the current loop being restricted.

In this way, the power conversion device 50 according to the first embodiment is such that the bus bar 7 is disposed in proximity to and parallel with the sealing wall 9 integrated with the metal case 8, which is the reference potential, and is disposed so that the vertical direction of the bus bar 7 forms the longer side of the cross-section, whereby the power conversion device 50 that reduces the occurrence of noise can be realized at a low cost, with excellent ease of assembly, and at a small size.

Second Embodiment

Figure 5:
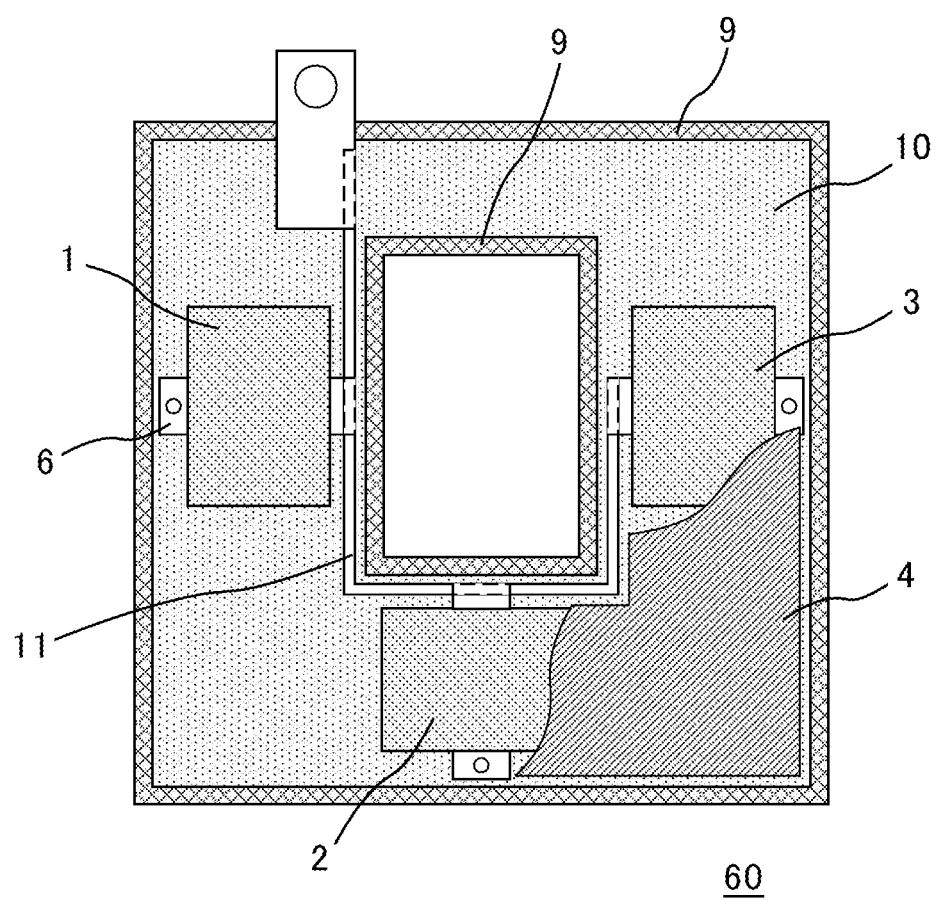
FIG. 5 is a plan view showing a power conversion device according to a second embodiment of the invention.
Figure 6:
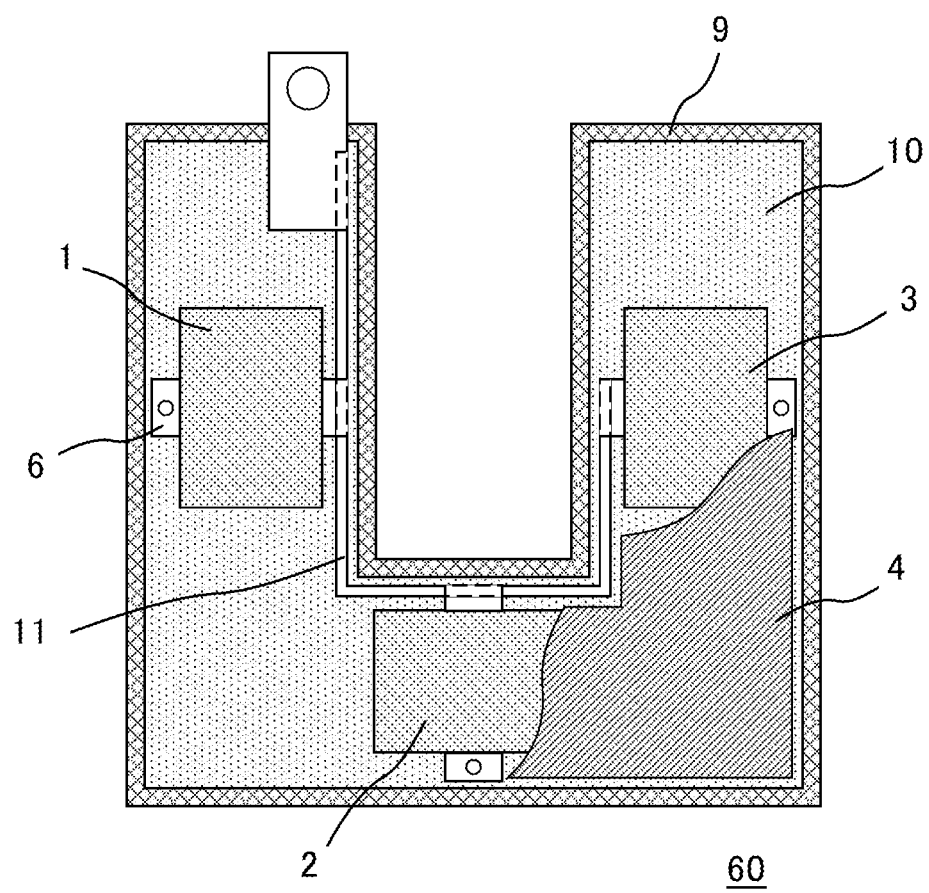
FIG. 6 is a plan view showing a modified example of the power conversion device according to the second embodiment of the invention.

Next, a power conversion device according to a second embodiment of the invention will be described. FIG. 5 and FIG. 6 are plan views showing a power conversion device 60 according to the second embodiment, wherein the same reference signs are allotted to portions identical to or corresponding to those in the first embodiment shown in FIG. 1 and FIG. 2, and one portion is omitted from the drawings.

The power conversion device 60 according to the second embodiment is such that the modules 1, 2, and 3 connected in series by a bus bar 11 are disposed annularly or radially in an annular metal case in FIG. 5, and are disposed annularly or radially in a U-form metal case in FIG. 6.

The power conversion device 60 having this kind of configuration is such that parasitic inductance caused by wiring exists in a path from a power supply (not shown) to the modules 1, 2, and 3, and the parasitic inductance is more likely to increase the farther a module is from the power supply. When the semiconductor elements in the modules 1, 2, and 3 operate and switch, and the current is repeatedly turned on and off, energy is accumulated in the parasitic inductance, and a resonance phenomenon occurs in the circuit. In particular, there is concern that overvoltage or overcurrent, and an increase in noise, will occur more noticeably than in another module in the module 3, in which the parasitic induction increases due to the module 3 being far from the power supply.

Therefore, in the second embodiment, in response to the annular or radial module disposition wherein routing of the bus bar 11 is longer, the bus bar 11 and the sealing wall 9 are also disposed in proximity and in parallel with respect to the module 3, which is far from the power supply. In this case, an outward path and a return path of current from the power supply are opposed in a range in which the bus bar 11 and the sealing wall 9 are disposed in proximity and in parallel, because of which the current loop inductance can be reduced, and the in-circuit resonance phenomenon occurring due to the disposition of the modules 1, 2, and 3 can be restricted. A principle of parasitic inductance reduction is as illustrated in FIG. 3.

That is, there is an advantage in that the parasitic inductance formed by the current loop is restricted, whereby an occurrence of overvoltage, overcurrent, and noise is reduced.

In this way, the power conversion device 60 according to the second embodiment is such that the bus bar 11 is disposed in proximity to and parallel with the sealing wall 9 integrated with an annular or U-form metal case, which is the reference potential, whereby the power conversion device 60 that reduces the occurrence of noise can be realized at a low cost, with excellent ease of assembly, and at a small size.

Third Embodiment

Figure 7:
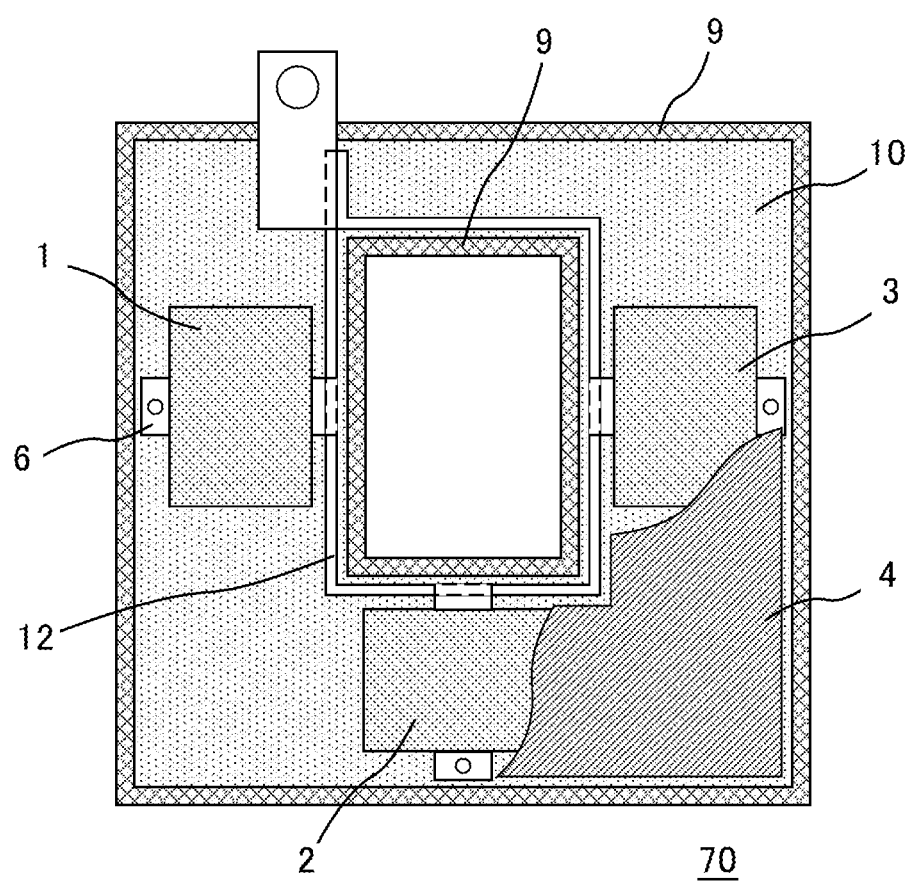
FIG. 7 is a plan view showing a power conversion device according to a third embodiment of the invention.

Next, a power conversion device according to a third embodiment of the invention will be described. FIG. 7 is a plan view showing a power conversion device 70 according to the third embodiment, wherein the same reference signs are allotted to portions identical to or corresponding to those in the second embodiment shown in FIG. 5, and one portion is omitted from the drawing.

The power conversion device 70 according to the third embodiment is such that the modules 1, 2, and 3 connected by a bus bar 12 having an annular structure are disposed annularly or radially in an annular metal case.

The power conversion device 70 having this kind of configuration is such that parasitic inductance caused by wiring in a path from a power supply (not shown) to the modules 1, 2, and 3 is reduced by a current path being parallelized by the modules 1, 2, and 3 being connected in series. However, the bus bar 12 itself is of an annular structure, because of which, when an external magnetic flux interlinks with the bus bar 12, an induced current flows into the bus bar 12 and resonates, leading to an occurrence of overvoltage or overcurrent, and an increase in noise.

However, the power conversion device 70 of the third embodiment is such that the bus bar 12 having the annular structure and the sealing wall 9 are disposed in proximity and in parallel, in which case an outward path and a return path of current from the power supply are opposed in a range in which the bus bar 12 and the sealing wall 9 are disposed in proximity and in parallel, because of which the current loop inductance can be reduced, and the in-circuit resonance phenomenon occurring due to the annular structure of the bus bar 12 can be restricted. That is, there is an advantage in that the parasitic inductance formed by the current loop is restricted, whereby an occurrence of overvoltage, overcurrent, and noise is reduced. A principle of parasitic inductance reduction is as illustrated in FIG. 3.

In this way, the power conversion device 70 according to the third embodiment is such that the bus bar 12 having the annular structure is disposed in proximity to and parallel with the sealing wall 9 integrated with an annular metal case, which is the reference potential, whereby the power conversion device 70 that reduces the occurrence of noise can be realized at a low cost, with excellent ease of assembly, and at a small size.

Fourth Embodiment

Figure 8:
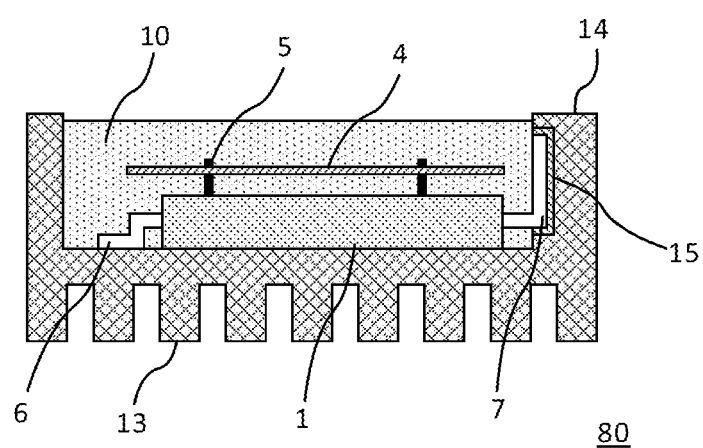
FIG. 8 is a sectional view showing a power conversion device according to a fourth embodiment of the invention.

Next, a power conversion device according to a fourth embodiment of the invention will be described. FIG. 8 is a sectional view showing a power conversion device 80 according to the fourth embodiment, wherein the same reference signs are allotted to portions identical to or corresponding to those in the first embodiment shown in FIG. 2.

The power conversion device 80 according to the fourth embodiment is configured of the module 1, the control substrate 4, the control wiring 5, the reference potential wiring 6, the bus bar 7, a metal case 13, a sealing wall 14, the sealing resin 10, and an electrical insulation member 15. Further, the module 1 is electrically connected via a reference potential of a power supply (not shown) and the reference potential wiring 6 to the metal case 13, and the control substrate 4, which controls so as to drive the module 1, is electrically connected via the control wiring 5. Also, the bus bar 7 is connected between the power supply, and the like, and a multiple of modules.

The metal case 13 has the sealing wall 14 integrally molded with the metal case 13, and a depressed portion that houses the bus bar 7, which is in contact across the electrical insulation member 15, is provided in the sealing wall 14. Further, the sealing wall 14 is erected on the periphery of the module 1, and the module 1 and one portion or the whole of the control substrate 4 are covered with the sealing resin 10.

A power conversion device having this kind of configuration is such that when a large current is caused to flow into the bus bar 7, Joule heat caused by electrical resistance of the bus bar 7 is generated, leading to a rise in temperature of the bus bar 7 itself and peripheral parts. Also, when increasing the sectional area of the bus bar 7 in order to lower the electrical resistance, the region occupied by the bus bar 7 increases, leading to an increase in size of the power conversion device.

However, the power conversion device 80 according to the fourth embodiment is such that the bus bar 7 is disposed across the electrical insulation member 15 so as to be in close contact with the sealing wall 14 having the depressed portion. In this case, the region occupied by the bus bar 7 is reduced by the bus bar 7 being disposed so as to be embedded in the depressed portion of the sealing wall 14, whereby the power conversion device 80 can be reduced in size.

Furthermore, by the bus bar 7 being in close contact with the sealing wall 14 across the electrical insulation member 15, heat of the bus bar 7 is transmitted to the sealing wall 14 by a material of good thermal conductivity being used for the electrical insulation member 15, a rise in temperature of the bus bar 7 is restricted, and dimensions of the bus bar 7 itself are reduced, whereby the power conversion device 80 can be reduced in size.

That is, while reducing an occurrence of overvoltage, overcurrent, and noise by restricting the parasitic inductance formed by the current loop, the region occupied by the bus bar 7 is reduced, whereby there is an advantage in that the power conversion device 80 can be reduced in size. A principle of parasitic inductance reduction is as illustrated in FIG. 3.

In this way, the power conversion device 80 of the fourth embodiment is such that a depressed portion is provided in the sealing wall 14 integrated with the metal case 13, and the bus bar 7 is disposed in close contact across the electrical insulation member 15, whereby the power conversion device 80 that is reduced in size while reducing an occurrence of noise can be realized.

Fifth Embodiment

Figure 9:
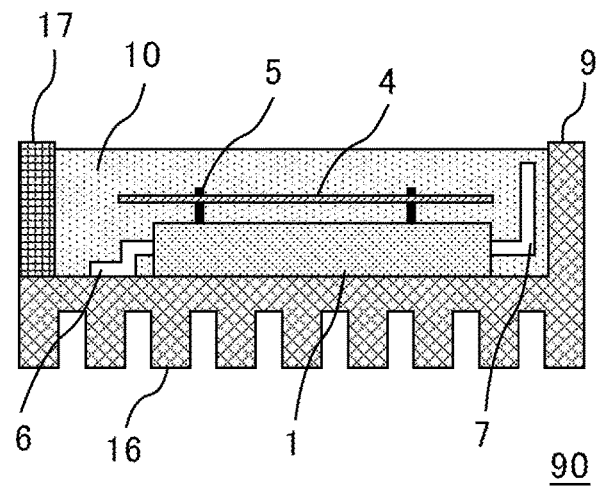
FIG. 9 is a sectional view showing a power conversion device according to a fifth embodiment of the invention.

Next, a power conversion device according to a fifth embodiment of the invention will be described. FIG. 9 is a sectional view showing a power conversion device 90 according to the fifth embodiment, wherein the same reference signs are allotted to portions identical to or corresponding to those in the first embodiment shown in FIG. 2.

The power conversion device 90 according to the fifth embodiment includes the module 1, the control substrate 4, the control wiring 5, the reference potential wiring 6, the bus bar 7, a metal case 16, the sealing wall 9, the sealing resin 10, and a sealing wall 17 configured of a member separate from the metal case 16. Further, the module 1 is electrically connected via a reference potential of a power supply (not shown) and the reference potential wiring 6 to the metal case 16, and the control substrate 4, which controls so as to drive the module 1, is electrically connected via the control wiring 5. Also, the bus bar 7 is connected between the power supply, and the like, and a multiple of modules.

The metal case 16 has the integrated sealing wall 9, which is erected on the periphery of the module 1 together with the sealing wall 17 configured of a member separate from the metal case 16, and the module 1 and one portion or the whole of the control substrate 4 are covered with the sealing resin 10.

A power conversion device having this kind of configuration is such that when a wall that seals a resin is configured integrated with the metal case 16, an amount of metal used increases, leading to a high cost and an increase in weight of the power conversion device. Therefore, the power conversion device 90 according to the fifth embodiment is such that the sealing wall 17 in a region that is not parallel to the bus bar 7 is a member separate from the metal case 16, and configured of a low-cost resin or the like, whereby the power conversion device 90 can be reduced in cost and reduced in weight.

That is, the power conversion device 90 according to the fifth embodiment is such that while reducing an occurrence of overvoltage, overcurrent, and noise by restricting the parasitic inductance formed by the current loop, the sealing wall 17, which is not parallel to the bus bar 7, is configured of a member separate from the metal case 16, because of which there is an advantage in that the power conversion device 90 is reduced in cost and reduced in weight. A principle of parasitic inductance reduction is as illustrated in FIG. 3.

In this way, the power conversion device of the fifth embodiment is such that by the sealing wall 17, which is not parallel to the bus bar 7, being provided and disposed as a body separate from the metal case 16, a power conversion device that is reduced in cost and reduced in weight, while reducing an occurrence of noise, can be realized.

Sixth Embodiment

Figure 10:
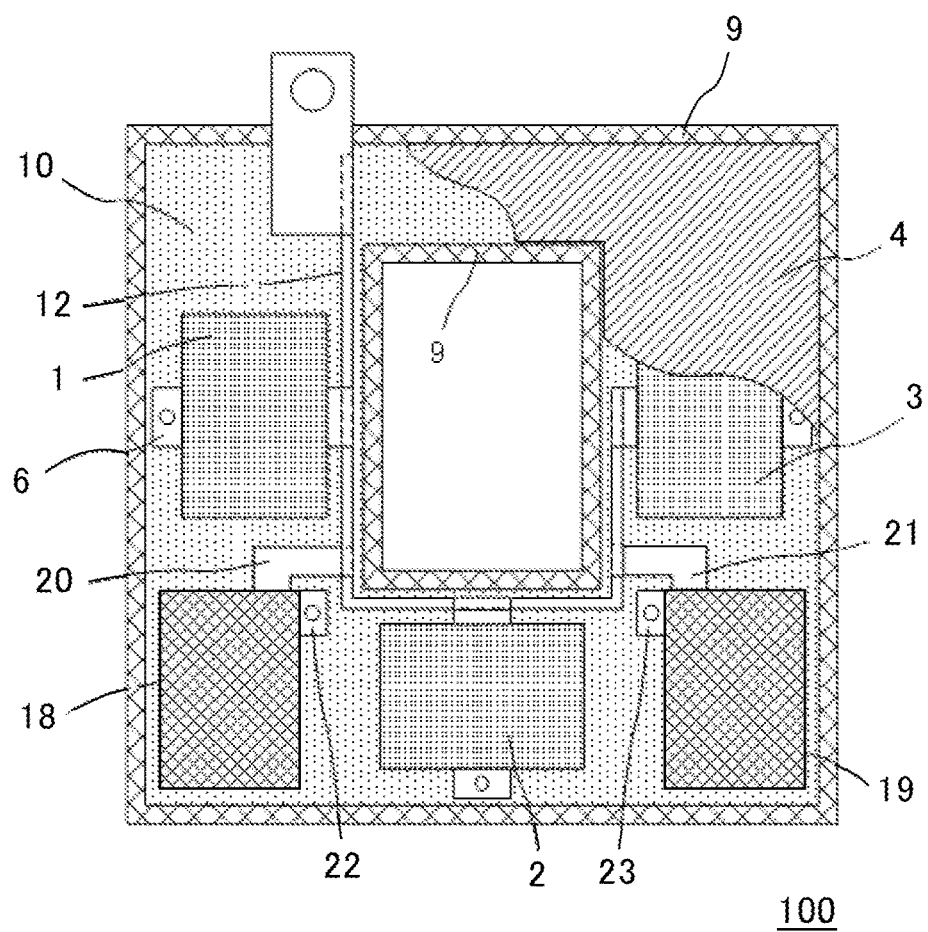
FIG. 10 is a plan view showing a power conversion device according to a sixth embodiment of the invention.

Next, a power conversion device according to a sixth embodiment of the invention will be described. FIG. 10 is a plan view showing a power conversion device 100 according to the sixth embodiment, wherein the same reference signs are allotted to portions identical to or corresponding to those in the second embodiment shown in FIG. 5, and one portion is omitted from the drawing.

The power conversion device 100 according to the sixth embodiment is such that the modules 1, 2, and 3, and capacitor blocks 18 and 19 configured of a single or multiple capacitors, connected by the bus bar 12 are disposed annularly or radially in the annular metal case 16. Positive terminals 20 and 21 of the capacitor blocks 18 and 19 are connected to the bus bar 12, while negative terminals 22 and 23 are connected to the metal case 16.

The power conversion device 100 having this kind of configuration is such that when the semiconductor elements in the modules 1, 2, and 3 switch, a charge can be supplied from the capacitor blocks 18 and 19. Consequently, parasitic inductance caused by wiring in a path from a power supply (the capacitor blocks 18 and 19 in this embodiment) to the modules 1, 2, and 3 is small compared with a case in which there are no capacitor blocks 18 and 19. In this kind of case too, according to the embodiment, the bus bar 12 and the sealing wall 9 are disposed in proximity and in parallel, whereby an advantage is obtained in that the parasitic inductance of the wiring from the capacitor blocks 18 and 19 to the modules 1, 2, and 3 is further reduced. Furthermore, an advantage is provided in that a ripple current imbalance in each capacitor block is reduced in comparison with a case in which the embodiment is not applied. Hereafter, a reason for this will be described.

In this embodiment, parasitic inductance of a loop formed by the modules 1, 2, and 3 and the capacitor blocks 18 and 19 is a sum of module inductance, capacitor inductance, and inductance of wiring connecting the modules 1, 2, and 3 and the capacitor blocks 18 and 19. Herein, by the modules 1, 2, and 3 and the capacitor blocks 18 and 19 being identical parts, the parasitical inductances thereof can be equal. Meanwhile, as positional relationships between the modules 1, 2, and 3 and the capacitor blocks 18 and 19 are determined by restrictions of inverter form, there is commonly a discrepancy in the parasitic inductance of the wiring connecting the modules 1, 2, and 3 and the capacitor blocks 18 and 19. However, the embodiment is such that the connection wiring inductance is reduced, because of which the discrepancy in the connection wiring parasitic inductance is relatively small compared with the module inductance or the capacitor block inductance. Consequently, a discrepancy in the parasitic inductance of the loop formed by the modules 1, 2, and 3 and the capacitor blocks 18 and 19 can be reduced, because of which the ripple current imbalance in each of the capacitor blocks 18 and 19 can be reduced.

In this way, the power conversion device 100 according to the sixth embodiment is such that the bus bar 12 having an annular structure is disposed in proximity to and parallel with the sealing wall 9 integrated with the annular metal case 16, which is the reference potential, whereby the power conversion device 100 that reduces the occurrence of noise can be realized at a low cost, with excellent ease of assembly, and at a small size.

In the first embodiment to the sixth embodiment, electrodes of the modules 1, 2, and 3 and the bus bars 7, 11, and 12 are described as being integrated, but the invention not being limited to this, it goes without saying that a configuration wherein wiring in the modules 1, 2, and 3 is configured of a lead frame or the like, and electrically connected to the external wiring of the bus bars 7, 11, and 12, or the like, can be used.

Also, the modules 1, 2, and 3 in the first embodiment to the sixth embodiment are such that a quantity and type of semiconductor elements incorporated are not limited, and it goes without saying that an arbitrary quantity of MOSFETs, IGBTs, or diodes, combinations thereof, and the like can be used.

Also, the modules 1, 2, and 3 in the first embodiment to the sixth embodiment are described with a configuration having an electrode forming the reference potential wiring 6 in an exterior as an example, but the invention not being limited to this, it goes without saying that a configuration wherein the modules 1, 2, and 3 are electrically connected to the metal cases 8, 13, and 16 via an internal lead frame, heat spreader, or the like can be used.

Also, it goes without saying that a structure, quantity, and type of the capacitor blocks 18 and 19 in the sixth embodiment are not limited.

Also, in the first embodiment to the sixth embodiment, a sealing material is described as being a resin, but the invention not being limited to this, it goes without saying that an arbitrary material can be used based on electrical insulation and thermal conductivity.

Also, in the first embodiment to the sixth embodiment, the metal cases 8, 13, and 16 are shown in the drawings to be of a structure having a heat dissipating projecting portion on the face opposite to the face to which the modules 1, 2, and 3 are attached, but the invention not being limited to this, it goes without saying that a channel may be provided in an interior of the metal cases 8, 13, and 16 having a projecting portion, and the metal cases 8, 13, and 16 also used for cooling with a fluid, or a channel may be provided in an interior, and cooling with a fluid used, without a heat dissipating projecting portion being provided on the metal cases 8, 13, and 16.

Heretofore, the power conversion device according to the first embodiment to the sixth embodiment of the invention has been described, but the embodiments can be freely combined, and each embodiment can be modified or abbreviated as appropriate, without departing from the scope of the invention.

The invention claimed is:

1. A power conversion device, comprising:
a module incorporating a semiconductor element;
a control substrate on which a circuit that controls so as to drive the semiconductor element is mounted;
control wiring that connects the module and the control substrate;
a sealing material that seals the module and one portion or a whole of the control substrate;
a metal case to which the module is attached, which has a sealing wall standing on a periphery of the module and holds the sealing material, and which is connected to a reference potential;
reference potential wiring that connects a reference potential of the module and the metal case; and
a bus bar that forms a current path to the module, wherein the bus bar is disposed in proximity to and parallel with the sealing wall.

2. The power conversion device according to claim 1, wherein the metal case has a heat dissipating projecting portion on a face opposite to a face to which the module is attached.

3. The power conversion device according to claim 1, wherein the metal case has a channel along which a fluid for dissipating heat of the module is caused to pass.

4. The power conversion device according to claim 2, wherein the metal case has a channel along which a fluid for dissipating heat of the module is caused to pass.

5. The power conversion device according to claim 1, wherein an interval between the bus bar and the sealing wall is equal to or greater than a distance such that electrical isolation is maintained with respect to a difference in potential between the bus bar and the metal case, and less than a dimension of a longer side of a cross-section of the bus bar.

6. The power conversion device according to claim 2, wherein an interval between the bus bar and the sealing wall is equal to or greater than a distance such that electrical isolation is maintained with respect to a difference in potential between the bus bar and the metal case, and less than a dimension of a longer side of a cross-section of the bus bar.

7. The power conversion device according to claim 1, wherein the metal case is of an annular structure, and at least two of the module are connected in series by the bus bar.

8. The power conversion device according to claim 2, wherein the metal case is of an annular structure, and at least two of the module are connected in series by the bus bar.

9. The power conversion device according to claims 1, wherein the metal case is of a U-form structure, and at least two of the module are connected in series by the bus bar.

10. The power conversion device according to claim 2, wherein the metal case is of a U-form structure, and at least two of the module are connected in series by the bus bar.

11. The power conversion device according to claim 1, wherein the metal case is of an annular structure, and at least two of the module are connected annularly or radially by the bus bar.

12. The power conversion device according to claim 2, wherein the metal case is of an annular structure, and at least two of the module are connected annularly or radially by the bus bar.

13. The power conversion device according to claim 1, wherein the metal case includes the sealing wall having a depressed portion that houses one portion or a whole of the bus bar across an electrical insulation member.

14. The power conversion device according to claim 2, wherein the metal case includes the sealing wall having a depressed portion that houses one portion or a whole of the bus bar across an electrical insulation member.

15. The power conversion device according to claim 1, wherein the metal case has the sealing wall in a range in which the metal case is disposed in proximity to and parallel with the bus bar, and the sealing wall outside the range is configured of a member separate from the metal case.

16. The power conversion device according to claim 2, wherein the metal case has the sealing wall in a range in which the metal case is disposed in proximity to and parallel with the bus bar, and the sealing wall outside the range is configured of a member separate from the metal case.

17. The power conversion device according to claim 1, comprising a capacitor block incorporating a single or multiple capacitors, wherein a positive terminal of the capacitor block is connected to the bus bar, and a negative terminal of the capacitor block is connected to the metal case.

18. The power conversion device according to claim 2, comprising a capacitor block incorporating a single or multiple capacitors, wherein a positive terminal of the capacitor block is connected to the bus bar, and a negative terminal of the capacitor block is connected to the metal case.

\* \* \* \* \*